US009503198B2

(12) United States Patent
Noda

(10) Patent No.: US 9,503,198 B2
(45) Date of Patent: Nov. 22, 2016

(54) RECEIVER AND RECEPTION METHOD

(71) Applicant: Masaki Noda, Chiyoda-ku (JP)

(72) Inventor: Masaki Noda, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 44 days.

(21) Appl. No.: 14/402,203

(22) PCT Filed: Sep. 27, 2012

(86) PCT No.: PCT/JP2012/074984
§ 371 (c)(1),
(2) Date: Nov. 19, 2014

(87) PCT Pub. No.: WO2014/049795
PCT Pub. Date: Apr. 3, 2014

(65) Prior Publication Data
US 2015/0155951 A1 Jun. 4, 2015

(51) Int. Cl.
*H04B 10/06* (2006.01)
*H04B 10/61* (2013.01)
*H03G 3/30* (2006.01)

(52) U.S. Cl.
CPC .......... *H04B 10/616* (2013.01); *H03G 3/3084* (2013.01)

(58) Field of Classification Search
CPC ..... H04B 10/61; H04B 10/616; H04B 10/64
See application file for complete search history.

(56) References Cited

U.S. PATENT DOCUMENTS 6,329,881 B1* 12/2001 Tachigori ............... H03F 3/08
250/214 A
7,268,628 B2* 9/2007 Noda ..................... H03F 1/34
330/308
2011/0293293 A1* 12/2011 Sugimoto ............... H03F 3/08
398/202

FOREIGN PATENT DOCUMENTS

| JP | 5-315879 A | 11/1993 |
| JP | 6 140843 | 5/1994 |
| JP | 8 162858 | 6/1996 |
| JP | 2000 124746 | 4/2000 |
| JP | 2000 252775 | 9/2000 |
| JP | 3329302 | 9/2002 |
| JP | 2009-49488 A | 3/2009 |
| JP | 4361087 | 11/2009 |

OTHER PUBLICATIONS

International Search Report Issued Jan. 8, 2013 in PCT/JP12/074984 Filed Sep. 27, 2012.

(Continued)

*Primary Examiner* — Dzung Tran
(74) *Attorney, Agent, or Firm* — Oblon, McClelland, Maier & Neustadt, L.L.P.

(57) ABSTRACT

A photodiode (11) of a receiver (10) outputs a current signal having a value that corresponds to the optical power of a received optical signal. A transimpedance amplifier (12) amplifies the current signal output from the photodiode (11), converts the current signal to a voltage signal, and further outputs the voltage signal that is converted from the current signal. A current detection circuit (17) generates a current having a value larger than that of the current signal output from the photodiode (11). A feedback resistor (16) changes a gain of the transimpedance amplifier (12) based on magnitude of the current generated by the current detection circuit (17).

9 Claims, 3 Drawing Sheets

(56) References Cited

OTHER PUBLICATIONS

Japanese Office Action issued Dec. 1, 2015 in Patent Application No. 2014-537964 (with partial English translation).

Japanese Office Action issued Jul. 28, 2015 in Patent Application No. 2014-537964 (with Partial English Translation).

Office Action mailed Aug. 18, 2016 in Chinese Application No. 201280076017.4 (w/partial English translation).

* cited by examiner

CHANGE IN INTENSITY OF LIGHT OVER TIME

RELATIONSHIPS OF EACH CURRENT

RECEIVER AND RECEPTION METHOD

TECHNICAL FIELD

The present disclosure relates to a receiver and a reception method.

BACKGROUND ART

A Passive Optical Networks (PON) system is one of the standards for access optical communication systems widely used to achieve public communication network using an optical fiber.

A PON system is constituted by a single Optical Line Terminal (OLT) which is a device on a provider station side, and constituted by multiple Optical Network Units (ONUs) which are subscriber terminal devices connected to the OLT via an optical star coupler.

Distances from an optical star coupler to ONUs vary for each ONU. The optical power of optical signals received by an OLT via an optical star coupler also varies for each ONU. Due to this, an OLT requires a receiver that provides a large dynamic range in order to receive optical signals as the optical power is varied.

A receiver having a large dynamic range, in general, employs Automatic Gain Control (AGC) to equalize amplitudes of converted voltage signals by implementing a gain (a conversion gain of a voltage over an input current) setting that is high when optical power of received optical signals is low, while implementing a low gain setting when the optical power of received optical signals is high.

There are various standards for the AGC. Patent Literature 1, for example, discloses a gain control method (feedback control method) for a transimpedance amplifier that uses continuous variance of the value of a feedback resistor (a resistor that defines a transimpedance amplifier gain) in the transimpedance amplifier, based on an average voltage value that is output from the transimpedance amplifier. Patent Literature 2, on the other hand, discloses a gain control method (feedforward control method) which directly uses a current that corresponds to the optical power in optical signals for the light received by a photodiode, to continuously vary the value of a feedback resistor in a transimpedance amplifier.

CITATION LIST

Patent Literature

Patent Literature 1: Japanese Patent No. 4361087
Patent Literature 2: Japanese Patent No. 3329302

SUMMARY OF INVENTION

Technical Problem

As discussed, a technique disclosed in Patent Literature 1, utilizes a control, known as feedback control, which is based on an average voltage value output from the transimpedance amplifier to achieve varied feedback resistor value of a transimpedance amplifier. Here, feedback control is performed based on a detection result (an average value of voltage that is output) so that when external factors occur that causes interference with the control, an operation of the control must be put off until effects from such external factors are in fact reflected on detection results. Accordingly, there is a problem with a required relatively long time period to achieve convergence of a transimpedance amplifier gain to a desired gain in an attempt to obtain a constant gain using feedback control.

As is also discussed, a technique disclosed in Patent Literature 2 utilizes control that varies the value of a feedback resistor in a transimpedance amplifier using a current that corresponds to the optical power of an optical signal in the light received by a photodiode, that is, utilizing feedforward control. Here, feedforward control entails elimination of an effect in advance when external factors occur that causes interference with the control, before such an effect from the external factors becomes evident. Feedforward control, therefore, is capable of obtaining convergence of a gain to a desired gain within a short period of time with respect to the feedback control.

However, as discussed, the technique disclosed in Patent Literature 2 directly uses a current corresponding to the optical power of optical signals in the light received by a photodiode to obtain varied feedback resistor values in a transimpedance amplifier in order to vary the gain of the transimpedance amplifier. In this respect, an output current of a photodiode must not be buried in noise, and thus, the output current must have, for example, a value above a predetermined threshold value. In order to obtain a larger current that is output from a photodiode, a high reverse bias voltage application across the photodiode is necessary if the optical power is to stay unchanged. An optical receiver such as a photodiode that receives optical signals, and functional components connected to the optical receiver in series (for example, a current mirror circuit is used in the technique disclosed in Patent Literature 2) require a high breakdown voltage. While other functional components (for example, the technique disclosed in Patent Literature 2 uses a trans-amp impedance 5 to vary the value of the feedback resistor) not being connected to the optical receiver that is applied thereacross a high reverse bias voltage, these functional components do not require a high breakdown voltage because a reverse bias voltage is not applied across these functional components. Accordingly, there is a problem with functional components in that the functional components are unable to be integrated on a single IC (Integrated Circuit) due to having different breakdown voltages.

The present disclosure is made in view of the aforementioned problems, and is capable of obtaining convergence of a gain to a desired gain within a short period of time in comparison to that of the feedback control, and also objectives of the present disclosure are to provide a receiver that can be established by functional components with an equivalent breakdown voltage, and to further provide a reception method thereof.

Solution to Problem

To achieve the objectives addressed above, an optical receiver of the receiver according to the present disclosure outputs a current signal including a value that corresponds to strength of an optical signal of received light. An amplifier-converter amplifies a current signal that is output from the optical receiver and converts to a voltage signal, and further, the amplifier-converter outputs this voltage signal that is converted from the current. A current generator generates a current in response to the current signal output from the optical receiver that has a value larger than that of the current signal. A changer changes a gain of the amplifier-converter based on magnitude of the generated current.

Advantageous Effects of Invention

The present disclosure is therefore capable of achieving convergence of a gain to a desired gain within a short period of time in comparison to feedback control, and is also capable of being established by functional components having an equivalent breakdown voltage.

DESCRIPTION OF EMBODIMENTS

Embodiment 1

Hereinafter, a receiver 10 of Embodiment 1 according to the present disclosure is described with reference to FIG. 1 and FIG. 2. The receiver 10 receives a packet signal (optical signal), converts the received packet signal to a voltage signal, and further outputs this signal. Here, the packet signal refers to a burst signal that exhibits an intermittent and discontinuous waveform.

Figure 1:
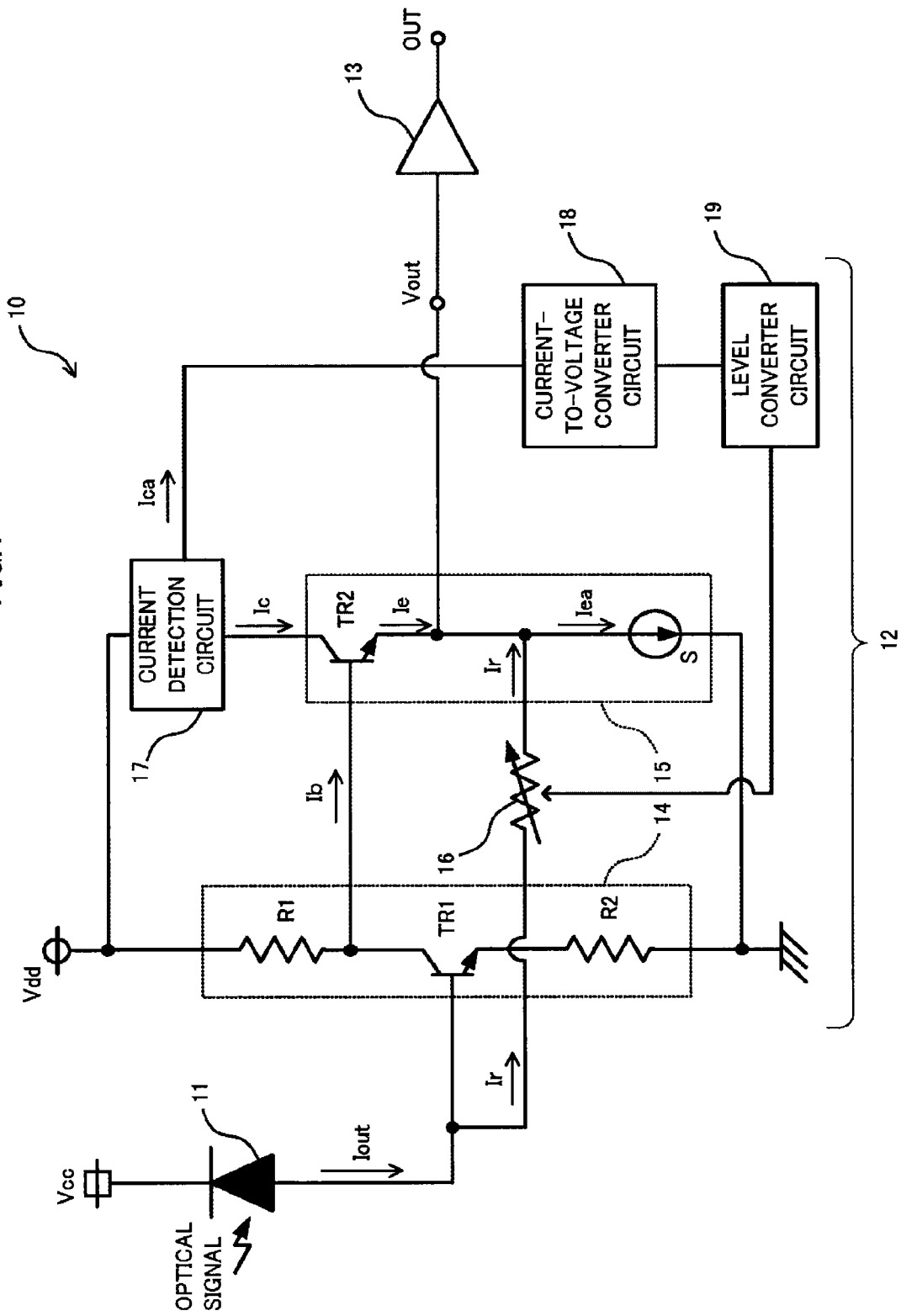
FIG. 1 is a circuit diagram illustrating a receiver of Embodiment 1 according to the present disclosure.
Figure 2A:
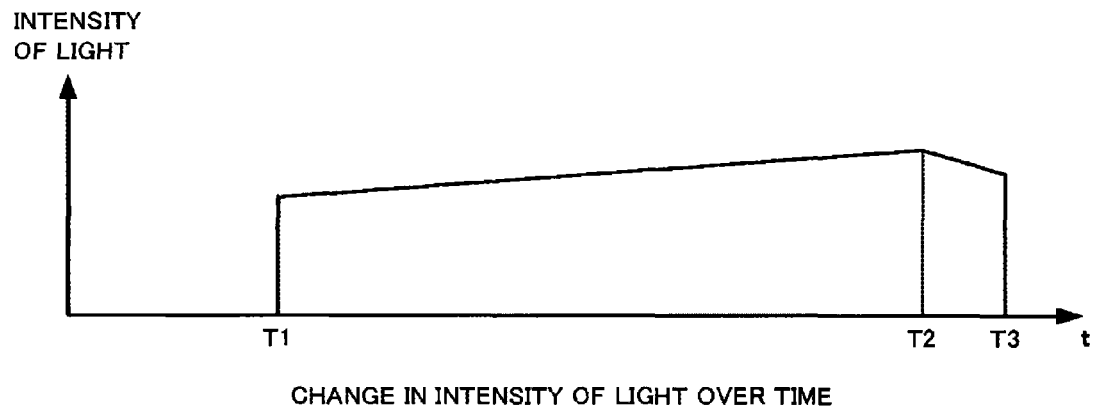
FIG. 2A is a figure depicting changes in optical power over time when an optical signal is received.

As presented in FIG. 1, the receiver 10 includes a photodiode 11, a transimpedance amplifier 12, and a limiting amplifier 13.

A direct voltage Vcc (for example, 50 volts) is applied to a cathode terminal of the photodiode 11. An anode terminal of the photodiode 11 is connected to a base terminal of a transistor TR1 in the transimpedance amplifier 12, and is also connected to one end of a feedback resistor 16 in the transimpedance amplifier 12. Due to this, a reverse bias voltage can be applied across the photodiode 11.

The photodiode 11 converts a received packed signal (optical signal) to a current, and outputs the current that is converted from the received packed signal to the transimpedance amplifier 12. In other words, the photodiode 11 is configured to output a current signal Iout having a value that corresponds to the optical power of the received packet signal, to the transimpedance amplifier 12.

The transimpedance amplifier 12 amplifies the current signal Iout that is output from the photodiode 11 then outputs the voltage signal that is converted from the current to the limiting amplifier 13.

The transimpedance amplifier 12 includes a common emitter circuit 14, an emitter follower circuit 15, a feedback resistor 16, a current detection circuit 17, a current-to-voltage converter circuit 18, and a level converter circuit 19.

The common emitter circuit 14 amplifies a current signal that is output from the photodiode 11 and outputs the amplified current signal to the emitter follower circuit 15.

The common emitter circuit 14 includes resistors R1, R2 and an npn type transistor TR1. A base terminal of the transistor TR1 is connected to an anode terminal of the photodiode 11 and is also connected to one end of the feedback resistor 16. An emitter terminal of the transistor TR1 is connected to one end of the resistor R2. The other end of the resistor R2 is grounded. A collector terminal of the transistor TR1 is connected to a base terminal of a transistor TR2 in the emitter follower circuit 15, and is also connected to one end of the resistor R1. Further, a direct voltage Vdd (for example, 3.3 volts) is applied to the other end of the resistor R1.

With the connections above, the common emitter circuit 14 amplifies portions of the output current signal Iout from the photodiode 11 by inputting them at the base terminal of the transistor TR1, and further, the common emitter circuit 14 outputs the amplified current signal from the collector terminal of the transistor TR1.

The emitter follower circuit 15 serves as a buffer amplifier, which converts the amplified current signal that is output from the common emitter circuit 14 to a voltage, and further outputs this voltage (voltage signal) converted from the amplified current signal to the limiting amplifier 13.

The emitter follower circuit 15 includes an npn type transistor TR2 and a current source S that feeds a direct current Iea.

The base terminal of the transistor TR2 is connected to the collector terminal of the transistor TR1 in the common emitter circuit 14. A collector terminal of the transistor TR2 is connected to a detection terminal (a terminal used for detection of the current Ic that flows into the collector terminal of the transistor TR2) that is provided on the current detection circuit 17 (a circuit configured to output the current Ica to the current-to-voltage converter circuit 18, where this current Ica has a value equivalent to that of the current Ic flowing into the collector terminal of the transistor TR2). The emitter terminal of the transistor TR2 is connected to the other end of the feedback resistor 16 and is also connected to an input terminal of the current source S. The emitter terminal of the transistor TR2 is connected to an input terminal of the limiting amplifier 13 via an output terminal Vout. In addition, the output terminal of the current source S is at the ground.

By having the connections above, the emitter follower circuit 15 is configured to input the amplified current signal that is output from the common emitter circuit 14 at the base terminal of the transistor TR2, and is configured to convert the amplified input current signal to the voltage, and to further output this voltage signal that is converted from the amplified input current signal, to the limiting amplifier 13 via the output terminal Vout.

The feedback resistor 16 serves to adjust a current Ir flowing into the base terminal of the transistor TR1 in the common emitter circuit 14. The feedback resistor 16 is connected in series between the base terminal of the transistor TR1 and the input terminal of the current source S.

The feedback resistor 16 adopts a variable resistor configured to vary its resistance value according to the value of output voltage from the level converter circuit 19. To give details, the feedback resistor 16 increases its resistance value as the output voltage from the level converter circuit 19 increases, and decreases its resistor value as the voltage output from the level convertor circuit 19 decreases. A gain (a conversion gain of a voltage signal over an input current signal) of the transimpedance amplifier 12 is determined based on the resistance value of the feedback resistor 16. More specifically, the larger the resistance value of the feedback resistor 16, the higher the gain of the transimpedance amplifier 12 becomes, while the smaller the resistance value of the feedback resistor 16, the lower the gain of the transimpedance amplifier 12 becomes.

As discussed above, the current detection circuit 17 outputs the current Ica to the current-to-voltage converter circuit 18, where the value of the current Ica is equivalent to that of the current Ic flowing into the collector terminal of the transistor TR2. The current detection circuit 17 is, for example, constituted by a current mirror circuit of multiplication factor 1. If the current detection circuit 17 is constituted by, for example, the current mirror circuit of multiplication factor 1, then an input terminal of this current mirror circuit (a current input terminal located where a diode is formed using the transistor) is connected to the collector terminal of the transistor TR2 to serve as a detection terminal so as to detect the current flowing into the collector terminal of the transistor TR2. Further, an output terminal (a current output terminal found where the transistor that is facing against the transistor forming a diode) of the current mirror circuit is connected to an input terminal of the current-to-voltage converter circuit 18.

Yet further, the input terminal of the current source S that feeds the direct current Iea is connected to the emitter terminal of the transistor TR2. The other end of the feedback resistor 16 allowing the current Ir to flow into the current source S, is connected between the emitter terminal of the transistor TR2 and the input terminal of the current source S. This way, the output current Ica from the current detection circuit 17 to the current-to-voltage converter circuit 18 can be provided by the constant current Iea flowing into the current source S subtracted by the current Ir that is flown into the current source S via the feedback resistor 16 (because the current flowing into the input terminal of the limiting amplifier 13 is nearly zero). Here, the current Iea that flows into the current source S is sufficiently large with respect to the current Iout. Thus, the current detection circuit 17 can generate the current Ica (current that has a value larger than that of the current signal Iout corresponding to (depending on) the value of current signal Iout output from the photodiode 11) which precisely reflects changes of flow in the current Ir.

The current-to-voltage converter circuit 18 converts the current Ica (a current having a value equivalent to that of the current Ic) output from the current detection circuit 17 to a voltage, and outputs this voltage converted from the current Ica to the level converter circuit 19. The current-to-voltage converter circuit 18 increases the output voltage as the current Ir flowing into the current source S via the feedback resistor 16 decreases and further the current Ica increases, and decreases the output voltage as the current Ir flowing into the current source S via the feedback resistor 16 is increased and the current Ica is decreased. The current-to-voltage converter circuit 18 is constituted by, for example, a resistor circuit (voltage divider circuit). The input terminal of the current-to-voltage converter circuit 18 is connected to the output terminal of the current detection circuit 17. Further, the output terminal of the current-to-voltage converter circuit 18 is connected to the input terminal of the level converter circuit 19.

The level converter circuit 19 reduces the voltage output from the current-to-voltage converter circuit 18 to a voltage having a value that falls within a predetermined range, and applies this reduced voltage to the input terminal of the feedback resistor 16. Assuming if an output voltage from the current-to-voltage converter circuit 18 is 0 volt to 5 volts and a predetermined range is given by 0 volt to 3 volts, then the level converter circuit 19 reduces the voltage from 5 volts to 3 volts, reduces the voltage from 2.5 volts to 1.5 volts, and 0 volt to 0 volt, and applies the reduced voltage to the input terminal of the feedback resistor 16 via the output terminal. The level converter circuit 19 is constituted by, for example, a divider circuit. The input terminal of the level converter circuit 19 is connected to the output terminal of the current-to-voltage converter circuit 18. The output terminal of the level converter circuit 19 is connected to the input terminal of the feedback resistor 16.

The limiting amplifier 13 amplifies an output voltage signal from the emitter follower circuit 15 at a predetermined rate of amplification, and outputs the amplified voltage signal to an OUT terminal. The limiting amplifier 13 is constituted by, for example, an operational amplifier. The input terminal of the limiting amplifier 13 is connected to an output terminal Vout of the emitter follower circuit 15. Further, the output terminal of the limiting amplifier 13 is connected to the OUT terminal.

Figure 2B:
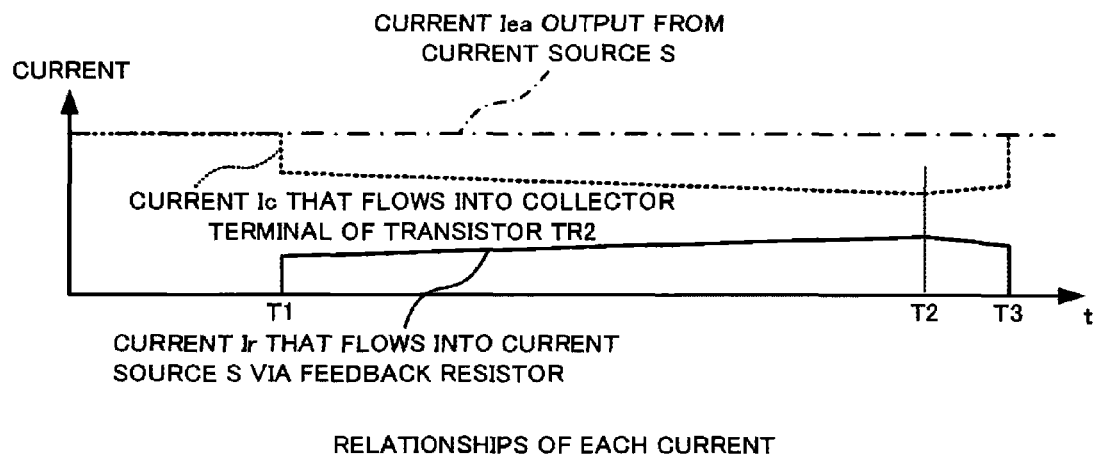
FIG. 2B is a figure depicting relationships among a current output from a current source, a current flowing into a current source via a feedback resistor, and a current flowing into a collector terminal of a transistor in an emitter follower circuit.

Here, operations of the receiver 10 with configurations above are described. During time zero to T1 shown in FIG. 2A, where no reception of a packet signal (optical signal) by the photodiode 11 occurs, that is, when no input is present, there is no output of current signal Iout from the photodiode 11 during time zero to T1 as shown in FIG. 2B. The current Ir that flows into the current source S through the feedback resistor 16 is therefore zero (see FIG. 2B). Note that the transistor TR1 (see FIG. 1) is in the cut-off state. At this point, the current Iea flows into the current source S. Since the current Ir being zero, this current Iea is given by the value equivalent to that of the current Ie output from the emitter terminal of the transistor TR2. After all, the transistor TR2 is in the conducting state. Here, the current Ib that flows into the base terminal of the transistor TR2 is sufficiently small with respect to both the current Ie output from the emitter terminal of the transistor TR2 and the current Ic flowing into the collector terminal of the transistor TR2. The current Ic flowing into the collector terminal of the transistor TR2 is, therefore, given by the value equivalent to that of the current Ie output from the emitter terminal of the transistor TR2, that is equivalent to the value of the current Iea flowing into the current source S.

While when reception of a packet signal (optical signal) by the photodiode 11 has occurred (see FIG. 2A, time T1 to time T3), a current signal Iout is output from the photodiode 11. By this, the current Ir flows through the feedback resistor 16 and further flows into the current source S. The transistor TR1 is in the conducting state. In this, the current flowing into the current source S is constant as is given by the current Iea shown in FIG. 2B. The output current Ie from the emitter terminal of the transistor TR2, in other words, the current Ic flowing into the collector terminal of the transistor TR2 can be given by the value of current Iea flowing into the current source S subtracted by the value of the current Ir, as presented in FIG. 2B, thereby a current that is greater than the current Ir is obtained.

Here, as the strength of the packet signal received by the photodiode 11 (see FIG. 2A, time T1 to time T2) increases to a higher strength, the value of the output current signal Iout from the photodiode 11 is increased to a larger value, and also the value of the current Ir increases to a larger value (see FIG. 2B, time T1 to time T2). Thus, as the strength of the packet signal received by the photodiode 11 increases, the smaller the value of the current Ic flowing into the collector terminal of the transistor TR2 becomes (see FIG. 2B, time T1 to time T2). In this regard, the output current Ica from the current detection circuit 17 to the current-to-voltage converter circuit 18 is a relatively small current. Due to this, the output voltage from the current-to-voltage converter circuit 18 to the level converter circuit 19 is also given by a small voltage. Further, the voltage applied to the input terminal of the feedback resistor 16 by the level converter circuit 19 is reduced to a small voltage and thus, the feedback resistor 16 lowers its resistance value. Thus, as the strength of the packet signal received by the photodiode 11 increases to a higher strength, then a gain (a conversion gain of a voltage signal over an input current signal) of the transimpedance amplifier 12 is lowered.

On the other hand, as the strength of the packet signal received by the photodiode 11 decreases to a lower strength (see FIG. 2A, time T2 to time T3), the output current signal Iout from the photodiode 11 is decreased to a smaller value, and so as with the current Ir decreased to a smaller value (see FIG. 2B, time T2 to time T3). In this regard, as the strength of the packet signal received by the photodiode 11 decreases, the current Ic flowing into the collector terminal of the transistor TR2 increases (see FIG. 2B, time T2 to time T3). This further provides a large output current Ica from the current detection circuit 17 to the current-to-voltage converter circuit 18. By this, a large output voltage from the current-to-voltage converter circuit 18 to the level converter circuit 19 is obtained. Further, the voltage applied to the input terminal of the feedback resistor 16 by the level converter circuit 19 is increased to a large voltage and thus, a resistor value of the feedback resistor 16 is made high. Hence, as the strength of the packet signal received by the photodiode 11 decreases to a lower strength, the gain (a conversion gain of a voltage signal over an input current signal) of the transimpedance amplifier 12 becomes higher.

As discussed, the feedback resistor 16 changes the gain of the transimpedance amplifier 12 based on the magnitude of output voltage from the level conversion circuit 19, that is in other words, the feedback resistor 16 changes the gain based on the magnitude of output current Ica from the current detection circuit 17. The transimpedance amplifier 12, hence is capable of equalizing amplitudes of the voltage signals that are output from the output terminal Vout.

As discussed above, the transimpedance amplifier 12 formed in the receiver 10 of the embodiment changes the gain based on the magnitude of current Ica that is output from the current detection circuit 17, in other words, changes the gain based on the output current Iout from the photodiode 11. According to the receiver 10 of the embodiment, convergence of a gain to a desired gain is achieved within a short period of time compared to that using the feedback control which carries out the control based on variations of the gain.

Yet further, according to the receiver 10 of the embodiment, the receiver 10 changes the gain of the transimpedance amplifier 12 based on the magnitude of the current Ica having the value larger than that of the current signal Iout that corresponds to (depends on) the value of the output current Iout from the photodiode 11. Specifically, the receiver 10 changes the gain of the transimpedance amplifier 12 by generating the current Ica having the value larger than that of the current signal Iout that corresponds to the value of the current Iout, and then changes the gain of the transimpedance amplifier 12 based on the magnitude of the generated current Ica rather than directly using the output current Iout from the photodiode 11 in doing so. This way, the transimpedance amplifier 12 merely serves to perform detection of the current Iout output from the photodiode 11 just to generate the current Ica (to change the gain). The voltage (voltage Vdd) that is applied across the transimpedance amplifier 12 can therefore be lowered with respect to the reverse bias voltage (voltage Vcc) applied across the photodiode 11. The transimpedance amplifier 12 does not require a breakdown voltage that is as high as the breakdown voltage of the photodiode 11. In the same way, the limiting amplifier 13 does not require a breakdown voltage that is as high as the breakdown voltage of the photodiode 11. Yet as the photodiode 11 being an exception, the receiver 10 does not require any devices that have a high breakdown voltage. The receiver 10 can therefore be established by functional components with an equivalent breakdown voltage, namely, by the transimpedance amplifier 12 and the limiting amplifier 13. According to the receiver 10 of the embodiment, the transimpedance amplifier 12 and the limiting amplifier 13 can be integrated on a single IC.

Embodiment 2

Figure 3:
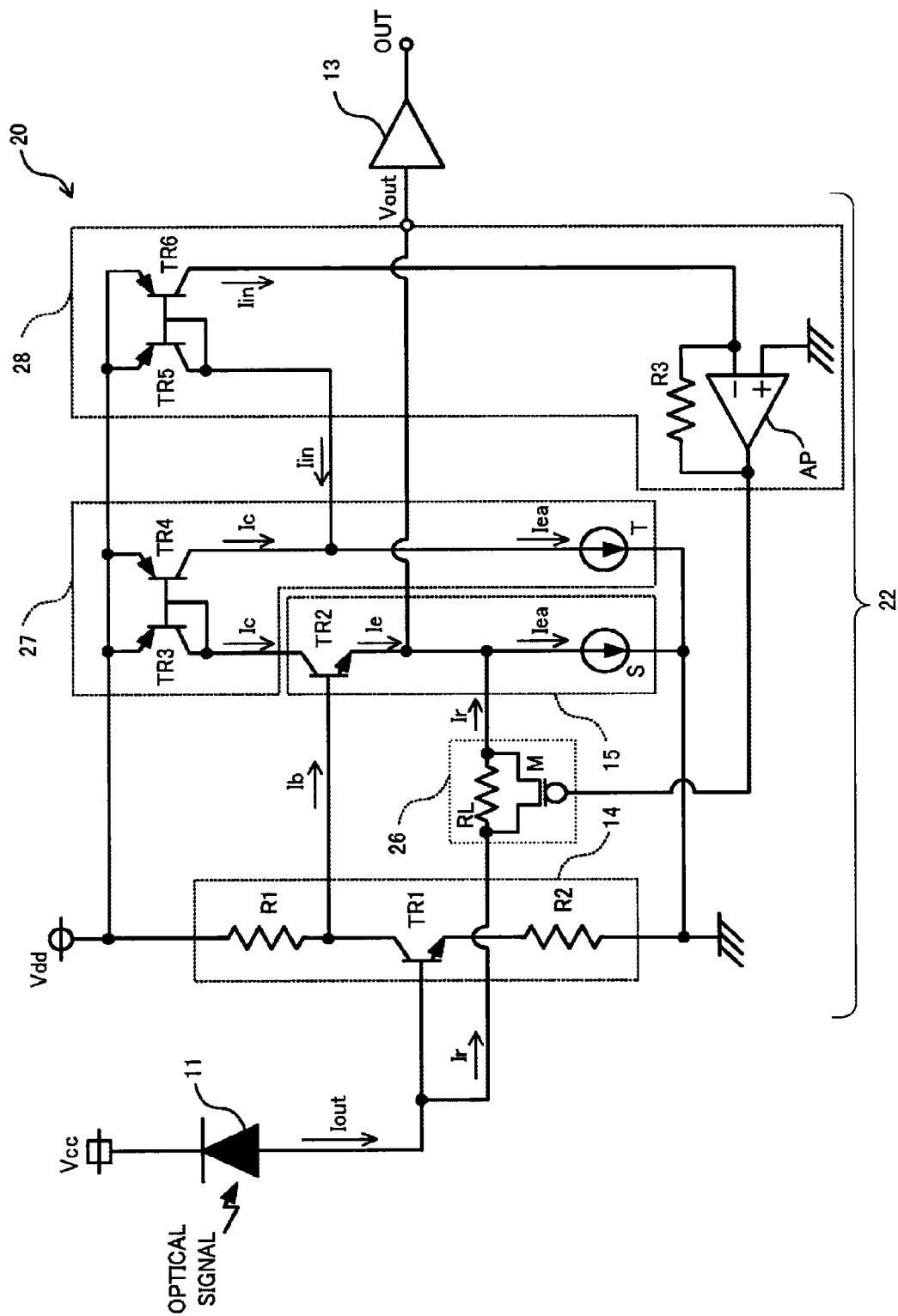
FIG. 3 is a circuit diagram illustrating a receiver of Embodiment 2 according to the present disclosure.

Hereinafter, a receiver 20 of Embodiment 2 according to the present disclosure is described with reference to FIG. 3. While the receiver 20 employs a part of its circuit configuration that differs from that of the receiver 10 in Embodiment 1, the receiver 20 involves a more specific form of the receiver 10. That is, the receiver 20 employs a transimpedance amplifier 22 instead of the transimpedance amplifier 12 used in the receiver 10.

The transimpedance amplifier 22 includes a feedback resistor section 26 instead of the feedback resistor 16, a current detection circuit 27 instead of the current detection circuit 17, and a converter circuit 28 instead of both the current-to-voltage converter circuit 18 and the level converter circuit 19. The rest of the circuit configuration in the receiver 20 remains the same as that used for the receiver 10. It should be noted that in FIG. 3, which is illustrating the circuit configuration of the receiver 20, the elements that are equivalent to those of the receiver 10 are denoted by the same reference numbers used for the receiver 10.

The transimpedance amplifier 22 includes a common emitter circuit 14, an emitter follower circuit 15, the feedback resistor section 26, the current detection circuit 27 and the converter circuit 28.

The feedback resistor section 26 adjusts a current Ir that flows into a base terminal of a transistor TR1 that is part of the common emitter circuit 14. The feedback resistor section 26 is connected in series between the base terminal of the transistor TR1 and an input terminal of a current source S.

To give details, the feedback resistor section 26 includes a resistor RL and a positive channel Metal Oxide Semiconductor (pMOS) type field-effect transistor M. One end of the resistor RL is connected to a source terminal of the field-effect transistor M and is also connected to the base terminal of the transistor TR1. The other end of the resistor RL is connected to a drain terminal of the field-effect transistor M and is also connected to the emitter terminal of the transistor TR2. Further, a gate terminal of the field-effect transistor M is connected to an output terminal of a dummy transimpedance amplifier AP that serves as the level converter circuit 19 in Embodiment 1.

The feedback resistor section 26 changes a resistance component based on the value of voltage applied to the gate terminal of the field-effect transistor M. More specifically, the feedback resistor section 26 increases a resistance component of the feedback resistor section 26 by increasing a resistance component between the drain and the source of the field-effect transistor M as the voltage applied to the gate terminal of the field-effect transistor M is increased. While the feedback resistor section 26 decreases its resistance component by decreasing the resistance component of the field-effect transistor M between the drain and the source as a voltage applied to a gate terminal of the field-effect transistor M is decreased. The gain of the transimpedance amplifier 12 (a voltage signal conversion gain over an input current signal) is determined based on the resistance component of the feedback resistor section 26. Specifically, the higher the resistance component of the feedback resistor 26, the higher the gain of the transimpedance amplifier 12 becomes, and the lower the resistance component of the feedback resistor section 26, the lower the gain of the transimpedance amplifier 12 becomes.

The current detection circuit 27 outputs a mirrored current Ic from a collector terminal of a transistor TR4, where the mirrored current Ic has a value equivalent to that of the current Ic flowing into the collector terminal of the transistor TR2. The current detection circuit 27 is constituted by pnp type transistors TR3, TR4 and a current source T.

A direct voltage Vdd is applied to an emitter terminal of the transistor TR3. A collector terminal of the transistor TR3 and a base terminal of the transistor TR3 are respectively connected to a base terminal of the transistor TR4 and the collector terminal of the transistor TR2. A direct voltage Vdd is applied to the emitter terminal of the transistor TR4. The collector terminal of the transistor TR4 is further connected to a collector terminal of a transistor TR5 in the converter circuit 28 and is also connected to an input terminal of the current source T (current source that feeds the current Iea having a value equivalent to that of the current drawn from the current source S). By having such connections above, the current detection circuit 27 forms a current mirror circuit of a multiplication factor 1 using the transistor TR3 and the transistor TR4. In this way, flow of the current Ic from the emitter terminal of the transistor TR3 (that is, an input terminal of the current mirror circuit) into the collector terminal of the transistor TR2 triggers the current detection circuit 27 to output the mirrored current Ic that has a value equivalent to such current Ic, from the collector terminal of the transistor TR4 (that is, an output terminal of the current mirror circuit).

Here, the current detection circuit 27 includes an external terminal G located between the collector terminal of the transistor TR4 and the input terminal of the current source T. In the current detection circuit 27, a current Iin is pulled from this external terminal and is delivered to the current source T. This current Iin adds to the amount of current that falls short in the mirrored current Ic due to the flow of the current Iea into the current source T. The mirrored current Ic has the value equivalent to the value of the current Ic flowing into the collector terminal of the transistor TR2, and the current Iea that flows into the current source T has the value equivalent to that of the current Iea flowing into the current source S. Thus, the current Iin flowing into the current source T by being pulled from the external terminal G has the value equivalent to that of the current Ir flown into the current source S via the feedback resistor section 26. Here, note that the currents Iea that respectively flow into the current source S and into the current source T are sufficiently large with respect to the current Iout. The current detection circuit 27 therefore generates the current Ic that has the value larger than that of the current signal Iout, where the value of the current Ic corresponds to (depends on) the value of the output current signal Iout from the photodiode 11, and further, the current Iin that precisely reflects the changes in the current Ir can be generated using this generated current Ic.

The converter circuit 28 converts the current Iin pulled from the external terminal G to a voltage, and applies this voltage converted from the current Iin to the gate terminal of the field-effect transistor M.

The converter circuit 28 is constituted by pnp type transistors TR5, TR6, a dummy transimpedance amplifier AP constituted by, for example, an operational amplifier, and a resistor R3. A direct voltage Vdd is applied to an emitter terminal of the transistor TR5. A collector terminal of the transistor TR5 and a base terminal of the transistor TR5 are respectively connected to a collector terminal of the transistor TR4 and the input terminal of the current source T. A direct voltage Vdd is applied to an emitter terminal of the transistor TR6. Further, a collector terminal of the transistor TR6 is connected to the input terminal of the dummy transimpedance amplifier AP and is also connected to one end of the resistor R3. By establishing such connections, the converter circuit 28 forms a current mirror circuit with the transistor TR5 and the transistor TR6. At the collector terminal of the transistor TR6, the converter circuit 28 outputs a current Iin having a value equivalent to that of the current Iin pulled in from the external terminal G, in response to the current Iin pulled from the external terminal G.

The collector terminal of the transistor TR5 is connected to a negative input terminal of the dummy transimpedance amplifier AP and is also connected to one end of the resistor R3. The output terminal of the dummy transimpedance amplifier AP and the other end of the resistor R3 are both connected to the gate terminal of the field-effect transistor M. A bias voltage is applied to the output terminal of the dummy transimpedance amplifier AP (not shown). Further, a positive input terminal of the dummy transimpedance amplifier AP is grounded.

By establishing the connections, an inverting amplifier circuit is formed using the dummy transimpedance amplifier AP and the resistor R3. This way, the converter circuit 28 is configured to increase the voltage applied to the gate terminal of the field-effect transistor M, as the current Iin output from the collector terminal of the transistor TR6 decreases (that is, as the optical power of a packet signal received by the photodiode 11 is lowered). Further, the converter circuit 28 is configured to decrease a voltage applied to the gate terminal of the field-effect transistor M, as the current Iin output from the collector terminal in the transistor TR6 increases (that is, as the optical power of the packet signal received by the photodiode 11 is made higher).

In the receiver 20 above, the photodiode 11 outputs the current Iout when a packet signal (optical signal) is received by the photodiode 11. The current Ir flows into the current source S through the feedback resistor section 26. At this, the transistor TR1 is in the conducting state. The current flowing into the current source S is given by the current Iea that remains constant. The output current Ie from the emitter terminal of the transistor TR2, which in other words, the current Ic flowing into the collector terminal of the transistor TR2, is given by the value of the current Iea flowing into the current source S subtracted by the value of current Ir.

Here, as the strength of the packet signal received by the photodiode 11 increases, the value of the current signal Iout output from the photodiode 11 increases, and also the value of the current Ir increases. Thus, as the strength of the packet signal received by the photodiode 11 increases, less current Ic flows into the collector terminal of the transistor TR2. As this results in a small flow of the current Ic to be output from the collector terminal of the transistor TR4, a large flow of current Iin from the external terminal G into the current source T can be obtained. Since a large current Iin output from the collector terminal of the transistor TR6 is further obtained, the voltage applied to the gate terminal of the field-effect transistor M as a consequence, becomes small. Further, due to a small resistance component between the drain and the source of the field-effect transistor M, a small resistance component for the feedback resistor section 26 is obtained. Accordingly, as the strength of the packet signal received by the photodiode 11 increases, the gain of the transimpedance amplifier 12 (a conversion gain of a voltage signal over an input current signal) is lowered.

On the other hand, as the strength of the packet signal received by the photodiode 11 decreases, the current signal Iout output from the photodiode 11 decreases, and also the current Ir decreases. In this regard, as the strength of the packet signal received by the photodiode 11 decreases, the current Ic flowing into the collector terminal of the transistor TR2 increases. As this further provides a large flow of current Ic output from the collector terminal of the transistor TR4, a small flow of current Iin from the external terminal G into the current source T is obtained. Since a small flow of current Iin output from the collector terminal of the transistor TR6 is obtained, the voltage applied to the gate terminal of the field-effect transistor M as consequence, becomes large. Further, due to a large resistance component between the drain and the source of the field-effect transistor M, a large resistance component for the feedback resistor section 26 is obtained. Accordingly, as the strength of the packet signal received by the photodiode 11 decreases, the gain of the transimpedance amplifier 12 (a conversion gain of a voltage signal over an input current signal) is increased.

As discussed, the feedback resistor section 26 changes the gain of the transimpedance amplifier 12 based on the magnitude of the voltage applied to the gate terminal of the field-effect transistor M, that is, in other words, changes the gain based on the magnitude of the mirrored current Ic output from the current detection circuit 27. Thus, the transimpedance amplifier 12 can equalize the amplitudes of the voltage signal output from the output terminal Vout.

As discussed, the transimpedance amplifier 22 formed in the receiver 20 of the embodiment changes the gain based on the magnitude of the mirrored current Ic output from the current detection circuit 27, that is, changes the gain based on the current Iout output from the photodiode 11. Therefore, the receiver 20 according to the embodiment is capable of obtaining convergence of a gain to a desired gain within a short period of time with respect to the feedback control which involves control performed based on the gain variations.

Further, according to the receiver 20 of the embodiment, the current Ic having a value larger than that of the current signal Iout corresponding to (depending on) the value of the current Iout output from the photodiode 11 is generated, and further, from the generated current Ic, the current Iin that precisely reflects the changes in flow of the current Ir is generated. The receiver 20 changes the gain of the transimpedance amplifier 22 based on the magnitude of the current Iin that is generated (based on the magnitude of the current Ic). More specifically, rather than directly using the current Iout output from the photodiode 11 in an attempt to change the gain of the transimpedance amplifier 22, the receiver 20 is adapted to change the gain of the transimpedance amplifier 22 by generating the current Iin from the current Ic, and based on the magnitude of the current Iin generated, the receiver 20 changes the gain of the transimpedance amplifier 22. This way, the transimpedance amplifier 22 merely serves as to perform detection of the current Iout output from the photodiode 11 just to generate the current Iin (to change the gain). The voltage (voltage Vdd) applied across the transimpedance amplifier 22 can be made lower than the reverse bias voltage (voltage Vcc) applied across the photodiode 11. So, the transimpedance amplifier 22 does not require a breakdown voltage that is as high as the breakdown voltage of the photodiode 11. In the same way, the feedback resistor section 26, the current detection circuit 27, the converter circuit 28, and the limiting amplifier 13 do not require a breakdown voltage that is as high as the breakdown voltage of the photodiode 11. Yet as the photodiode 11 being an exception, the receiver 20 does not require any devices with a high breakdown voltage. The receiver 20 can therefore be configured by functional components with an equivalent breakdown voltage, namely, by the transimpedance amplifier 22, the feedback resistor section 26, the current detection circuit 27, the converter circuit 28, and the limiting amplifier 13. According to the receiver 20 of the embodiment, the transimpedance amplifier 22, the feedback resistor section 26, the current detection circuit 27, the converter circuit 28, and the limiting amplifier 13 can be integrated on the same IC.

If the dummy transimpedance amplifier AP formed in the receiver 20 of the embodiment is to be configured by the common emitter circuit 14 and the emitter follower circuit 15 as in the transimpedance amplifier 22, the same circuit configuration would be employed by both the dummy transimpedance amplifier AP and the transimpedance amplifier 22. Further, regardless of any changes occurred in environmental conditions such as a change in atmospheric temperature, a change within the direct voltage Vdd, or a change occurred in both conditions, a voltage applied to the base terminal of the transistor TR1 in the transimpedance amplifier 22, and a voltage applied to the input terminal of the dummy transimpedance 10 yet exhibit variations that are mostly the same. Yet further, due to the source terminal of the field-effect transistor M within the feedback resistor section 26 being connected to the base terminal of the transistor TR1 of the transimpedance amplifier 22, a voltage applied between the source and the gate terminals of the field-effect transistor M also exhibits the variations that are mostly the same as that of the voltage applied to the base terminal of the transistor TR1. According to the receiver 20 of the embodiment, changes occurred in environmental condition has little influence on the receiver 20.

While embodiments of the present disclosure have been described above, it should be understood that the present disclosure is not limited to such embodiments, and various modifications and applications are possible.

To given an example, the photodiode is used to receive the packet signals (optical signals) in the receivers 10, 20 described in the embodiments, but is not limited to this. That is to say, the receivers 10, 20 in the embodiments may use a phototransistor as an alternative to the photodiode to receive the packet signals.

The current-to-voltage converter circuit 18 of the receiver 10 in Embodiment 1 reduces the output voltage as the current Ica decreases due to increase in the current Ir flowing into the current source S via the feedback resistor 16, while increases the output voltage as the current Ica increases due to decrease in the current Ir flowing into the current source S via the feedback resistor 16; however no limitation applies to such implementations. That is to say, the current-to-voltage converter circuit 18 may be configured to increase the output voltage as the current Ica decreases due to increase in the current Ir flowing into the current source S via the feedback resistor 16, and may be configured to reduce the output voltage as the current Ica increases due to decrease in the current Ir flowing into the current source S via the feedback resistor 16. In this approach, the feedback resistor 16 may use a configuration as follows. That is, the feedback resistor 16 may be configured to lower its resistance value as the voltage output from the level converter circuit 19 becomes larger, and may be configured to increase its resistance value as the voltage output from the level converter circuit 19 becomes smaller.

In the receiver 20 of Embodiment 2, the current mirror circuit constituted by the transistors TR5, TR6 is formed in the converter circuit 28, yet which is not limited to such implementations. The current mirror circuit constituted by the transistors TR5, TR6 may be removed from the converter circuit 28. In such configuration, the current source T provided to the current generator 27 is removed, and the collector terminal of the transistor TR4 provided to the current generator 27 may be connected to the input terminal of the dummy transimpedance amplifier AP and also to one end of the resistor R3.

With this configuration, the transimpedance amplifier 22 formed in the receiver 20 is capable of detecting the current Iout output from the photodiode 11. According to the receiver 20 above, the gain of the transimpedance amplifier 22 is changed based on the magnitude of the current Ic that has the value larger than that of the current signal Iout corresponding to (depending on) the value of the current Iout output from the photodiode 11. More specifically, instead of directly using the output current Iout from the photodiode 11 in an attempt to change the gain of the transimpedance amplifier 22, the receiver 20 changes the gain of the transimpedance amplifier 22 by generating the current Ic that has the value larger than that of the current signal Iout corresponding to the value of the current Iout, and changes the gain based on the magnitude of the current Ic generated. Hence, the transimpedance amplifier 22 merely serves to perform detection of the output current Iout from the photodiode 11, which is used just to generate the current Ic (to change the gain). The voltage (voltage Vdd) applied across the transimpedance amplifier 22 can be lowered to a voltage that is indeed lower than the reverse bias voltage (voltage Vcc) applied across the photodiode 11. The transimpedance amplifier 22 does not require a breakdown voltage that is as high as the breakdown voltage of the photodiode 11. In the same way, the feedback resistor section 26, the current detection circuit 27, the converter circuit 28, and the limiting amplifier 13 do not require a breakdown voltage that is as high the breakdown voltage of the photodiode 11. Yet as the photodiode 11 being an exception, the receiver 20 does not require devices that have a high breakdown voltage.

The receiver 20 can therefore be configured by functional components with an equivalent breakdown voltage; namely, by the transimpedance amplifier 22 (a configuration that the current mirror circuit constituted by the transistors TR5, TR6, and the current source T are being removed therefrom), the feedback resistor section 26, the current detection circuit 27, the converter circuit 28, and the limiting amplifier 13. According to the receiver 20 with such configuration of having the current mirror circuit constituted by the transistor TR5, TR6 and the current source T that are being removed therefrom, the transimpedance amplifier 22, the feedback resistor section 26, the current detection circuit 27, the converter circuit 28, and the limiting amplifier 13 can be integrated on a single IC.

In the receiver 20 of Embodiment 2, the current mirror circuit is configured using the pnp type transistors TR3 to TR5, however this is not a limitation in this or other embodiments. The receiver 20 may form a current mirror circuit using npn type transistors TR3 to TR5.

The receiver 20 of Embodiment 2 employs the pMOS (positive channel Metal Oxide Semiconductor) type transistor M for the feedback resistor section 26, yet which is not limited to this. An nMOS (negative channel Metal Oxide Semiconductor) type transistor may be used for the feedback resistor section 26 as an alternative to the pMOS type transistor M. For this case, the dummy transimpedance amplifier AP and the resistor R3 are taken off from the receiver 20, and instead, a non-inverting circuit is used. An input terminal of the non-inverting circuit is connected to the collector terminal of the transistor TR6 in the converter circuit 28, and an output terminal of the non-inverting circuit is connected to a gate terminal of the nMOS type transistor. The source terminal of the nMOS type transistor may then be connected to the base terminal of the transistor TR1 in the common emitter circuit 14, and a drain terminal of the nMOS type transistor may be connected to the input terminal of the current source S.

Modifications and variations can be made without departing from spirit and scope of the present disclosure, as will be apparent to those skilled in the art. It should be noted that the above embodiments are meant only to be illustrative of those embodiments and are not intended to be limiting the scope of the present disclosure. Accordingly, the scope of the present disclosure should not be determined by the embodiments illustrated, but by the appended claims. It is therefore the intention that the present disclosure be interpreted to include various modifications that are made within the scope of the claims and their equivalents.

REFERENCE SIGNS LIST 10, 20 Receiver
11 Photodiode
12, 22 Transimpedance amplifier
13 Limiting amplifier
14 Common emitter circuit
15 Emitter follower circuit
16 Feedback resistor
17, 27 Current detection circuit
18 Current-to-voltage converter circuit
19 Level converter circuit
26 Feedback resistor section
28 Converter circuit

The invention claimed is:

1. A receiver comprising:
an optical receiver that outputs a current signal including a value that corresponds to strength of an optical signal received;
an amplifier-converter that amplifies the current signal output from the optical receiver, converts the amplified current signal to a voltage signal, and outputs the voltage signal that is converted from the amplified current signal;
a current generator that generates a current in response to the current signal output from the optical receiver that has a value larger than that of the current signal and
a changer having a variable resistance that changes a gain of the amplifier-converter based on magnitude of a current generated by the current generator.

2. The receiver according to claim 1, wherein
the current generator is configured to generate a current including a value equivalent to that of the current amplified by the amplifier-converter, wherein the current amplified by the amplifier-converter originates in the current signal output from the optical receiver, and
the changer is configured to change a gain of the amplifier-converter based on magnitude of the current generated by the current generator, wherein the current generated by the current generator has a value equivalent to that of the amplified current produced by amplifying the current signal by the amplifier-converter.

3. The receiver according to claim 2, the amplifier-converter further comprising
a common emitter circuit including a first transistor, wherein the common emitter circuit is configured to input and amplify a current signal output from the optical receiver at a base terminal of the first transistor, and is further configured to output the amplified current signal from a collector terminal of the first transistor, and
an emitter follower circuit including a second transistor including a base terminal connected to the collector terminal of the first transistor provided on the common emitter circuit, an emitter terminal of the second transistor connected to an output terminal that outputs a voltage signal produced by converting the amplified current signal to a voltage, and a collector terminal of the second transistor connected to a detection terminal of the current generator for detecting a current flowing into the collector terminal of the second transistor, wherein
the current generator is configured to generate a current including a value equivalent to that of a current flowing into the collector terminal of the second transistor detected via the detection terminal, and
the changer is configured to change a gain of the amplifier-converter depending on magnitude of the current generated by the current generator, wherein the current has a value equivalent to that of the current flowing into the collector terminal of the second transistor.

4. The receiver according to claim 3, further comprising
a first current source that outputs a constant current, and including an input terminal connected to the emitter terminal of the second transistor in the emitter follower circuit, wherein
the changer is connected in series between the base terminal of the first transistor and the input terminal of the first current source, and is configured to change a gain of the amplifier-converter by changing a resistance component within the changer depending on magnitude of a current generated by the current generator, and
the current generator is configured to generate a current of a value equivalent to that of a current defined by subtracting from the constant current flowing into the first current source the current flowing into the first current source via the changer.

5. The receiver according to claim 4, further comprising
a current-to-voltage converter that converts a current generated by the current generator to a voltage, and applies the voltage that is converted from the current to the input terminal of the changer, wherein
the current-to-voltage converter is configured to increase a voltage applied to the input terminal of the changer as the current flowing into the first current source via the changer is decreased, and also as the current generated by the current generator is increased, while the current-to-voltage converter is configured to decrease a voltage applied to the input terminal of the changer as the current flowing into the first current source via the changer is increased and the current generated by the current generator is decreased, and
the changer is configured to increase a gain of the amplifier-converter by increasing a resistance component within the changer as the voltage applied to the input terminal is increased, while configured to reduce the gain of the amplifier-converter by decreasing the resistance component within the changer as the voltage applied to the input terminal is decreased.

6. The receiver according to claim 3, further comprising
a first current source that outputs a constant current, and includes an input terminal connected to the emitter terminal of the second transistor that is provided on the emitter follower circuit, wherein
the changer is connected in series between the base terminal of the first transistor and the input terminal of the first current source, and is configured to change a gain of the amplifier-converter by changing a resistance component within the changer depending on magnitude of a current generated by the current generator,
the current generator further comprises
a first current mirror circuit including an input terminal connected to the collector terminal of the second transistor that is provided on the emitter follower circuit such that a mirrored current including a value equivalent to that of a current input at the input terminal of the first current mirror circuit is output from an output terminal of the first current mirror circuit,
a second current source that includes an input terminal connected to the output terminal of the first current mirror circuit, and outputs a constant current including a value equivalent to that of the first current source, and
an external terminal that is connected between the output terminal of the first current mirror circuit and the input terminal of the second current source, wherein
an amount of shortage of current in the mirrored current output from the output terminal of the first current mirror circuit, that is the amount falling short compared to the constant current flowing into the second current source, is pulled from the external terminal to add to the amount, such that a current having a value equivalent to that of the current flowing into the first current source via the changer is generated.

7. The receiver according to claim 6, further comprising
a second current mirror circuit including an input terminal connected to the external terminal of the current generator, such that a mirrored current including a value equivalent to that of the current pulled from the external terminal via the input terminal of the second current mirror circuit, is output from an output terminal thereof, and
an inverting amplifier circuit including an input terminal connected to the output terminal of the second current mirror circuit, and an output terminal thereof connected to the input terminal of the changer, wherein
the inverting amplifier circuit is configured to increase a voltage applied to the input terminal of the changer as a current flowing into the first current source via the changer is decreased and a mirrored current output from the second current mirror circuit is decreased, while the inverting amplifier circuit is configured to decrease a voltage applied to the input terminal of the changer as the current flowing into the first current source via the changer is increased and the mirrored current output from the second current mirror circuit is increased, and
the changer is configured to increase a gain of the amplifier-converter by increasing a resistance component within the changer as a voltage applied to the input terminal is increased, while configured to reduce a gain of the amplifier-converter by decreasing the resistance component within the changer as a voltage applied to the input terminal is decreased.

8. The receiver according to claim 7, wherein
the changer further comprises
a field-effect transistor, and
a resistor including one terminal connected to a source terminal of the field-effect transistor, and the other terminal connected to a drain terminal of the field-effect transistor, wherein
the input terminal of the changer serves as a gate terminal of the field-effect transistor.

9. A reception method for a receiver, comprising the steps of:
outputting a current signal including a value that corresponds to strength of an optical signal received, from an optical receiver;
amplifying a current signal output from the optical receiver, converting the amplified current signal to a voltage signal, and outputting the voltage signal that is converted from the amplified current signal;
generating a current in response to the current signal output from the optical receiver that includes a value larger than that of the current signal; and
changing a gain of the step of amplifying and converting by varying a resistance based on magnitude of the current generated in the step of generating the current.

* * * * *